United States Patent [19]

Buchanan et al.

[11] Patent Number: 5,204,616
[45] Date of Patent: Apr. 20, 1993

[54] IN-CIRCUIT TEST FIXTURE FOR LEADED PACKAGES

[75] Inventors: James E. Buchanan, Bowie, Md.; Dan B. Tolley, Wytheville, Va.; Chester W. Waldvogel, Queentown, Md.

[73] Assignee: The United States of America as represented by the Secretary of the Air Force, Washington, D.C.

[21] Appl. No.: 589,715

[22] Filed: Sep. 25, 1990

Related U.S. Application Data

[63] Continuation-in-part of Ser. No. 343,924, Apr. 26, 1990, abandoned.

[51] Int. Cl.⁵ .................. G01R 31/02; G01R 1/04
[52] U.S. Cl. .......................... 324/158 P; 324/158 F
[58] Field of Search ............ 324/158 F, 158 P, 73.1, 324/72.5; 439/68-70, 71, 73, 912; 437/8

[56] References Cited

U.S. PATENT DOCUMENTS

| | | | |
|---|---|---|---|
| 4,344,033 | 8/1982 | Stowers et al. | 324/158 F |
| 4,667,154 | 5/1987 | Allerton et al. | 324/158 P |
| 4,668,041 | 5/1987 | La Komski et al. | 324/158 F |
| 4,689,556 | 8/1987 | Cedrone | 324/158 P |
| 4,697,143 | 9/1987 | Lockwood et al. | 324/158 P |
| 4,701,703 | 10/1987 | Malloy | 324/158 F |
| 4,835,449 | 5/1989 | Jones et al. | 324/158 F |
| 4,853,626 | 8/1989 | Resler | 324/158 F |
| 4,862,076 | 8/1989 | Renner et al. | 324/158 F |
| 4,897,602 | 1/1990 | Lin et al. | 324/158 F |
| 4,899,107 | 2/1990 | Corbett et al. | 324/158 F |
| 4,962,356 | 10/1990 | Eberlein et al. | 324/158 F |
| 4,963,821 | 10/1990 | Janko et al. | 324/158 F |

*Primary Examiner*—Vinh Nguyen
*Attorney, Agent, or Firm*—William Stepanishen; Donald J. Singer

[57] ABSTRACT

An in-circuit test probe apparatus for probing the finely and closely spaced leads of an LSI circuit package in order to monitor the signals on the pins. A magnetic holding assembly is utilized to attach the test probe apparatus to the circuit package which is positioned with a cavity in the bottom of the test probe apparatus. A layer of silicon rubber is positioned between rough and fine probe pin location members to hold the probes during test and to allow easy insertion and removal of the test probe.

13 Claims, 2 Drawing Sheets

IN-CIRCUIT TEST FIXTURE FOR LEADED PACKAGES

STATEMENT OF GOVERNMENT INTEREST

The invention described herein may be manufactured and used by or for the Government for governmental purposes without the of any royalty thereon.

This is a continuation-in-part of Ser. No. 07/343,924 filed of Apr. 26, 1990,. now abandoned.

BACKGROUND OF THE INVENTION

The present invention relates broadly to an IC package test fixture, and more particularly to an in-circuit test apparatus for leaded packages with close lead spacing.

The state of the art of an in-circuit test apparatus for leaded packages with close lead spacing is well represented and alleviated to some degree by the prior art apparatus and approaches which are contained in the following U.S. Pat. Nos.:

U.S. Pat. No. 4,344,033 issued to Stowers et. al. on Aug. 10, 1982;

U.S. Pat. No. 4,667,154 issued to Allerton et. al. on May 19, 1987;

U.S. Pat. No. 4,689,556 issued to Cedrone of Aug. 25, 1987;

U.S. Pat. No. 4,697,143 issued to Lockwood et. al. on Sep. 28, 1987; and

U.S. Pat. No. 4,701,703 issued to Malloy on Oct. 29, 1987.

The Stowers et. al. patent discloses a vacuum actuated test fixture for printed circuit boards which utilizes a yielding diaphragm assembly with rigid frame and spring-loaded diaphragm base plate, to distribute downward atmospheric pressure evenly over the entire area of the board without localized stress concentrations. A captive removable diaphragm frame and quick-acting spring-loaded cam latches assure a positive seal around the margin of the diaphragm assembly and along top and bottom edge portions thereof.

The Allerton et. al. patent describes an electrical contact assembly for a tester which comprises a ring element, a plurality of spring loaded contact probes, an elastic retaining band and alignment pins.

The Cedrone patent discusses a contractor assembly for testing electronic devices that are packaged with a dual-in-line pin array that has an insulating base that mounts two rows of contacts, each adapted to flex into electrical connection with a pin of the device, and a pair of flexible ground planes each spaced closely from an associated one row of said contacts.

The Lockwood et. al. patent is directed to a wafer probe which is provided having metallic transmission lines mounted on a tapered alumina substrate generally surrounded by microwave absorbing material. The probe provides for on-wafer measurements of small planar devices at frequencies from DC to at least 18 GHz with low inductance, and with constant characteristic impedance from the probe external cable terminal to the point of contact on device being probed.

The Malloy patent describes an in-circuit test fixture for use in making a non-functional electrical inspection of individual components and/or circuit paths on a printed circuit board or wired backpanel assembly.

In the prior art, dual-in-line packages which have a 0.1 inch lead spacing, can be probed by hand but with great care. However, as package lead spacing has decreased to the 0.020 inch range, hand probing is no longer practical. Engineers and technicians can no longer hand probe a PC board without serious risk of electrically damaging the outputs (by touching two or more of the outputs simultaneously) or physically damaging the small leads. High density circuit boards utilizing devices with close lead spacing must be designed so that a minimum amount of hand probing is required. However, regardless of the amount of care given to testability features, eventually some problems require hand probing. Hence, some type of test adapter or fixture is needed for high density packages that will gently and precisely attach test connections without requiring elaborate attachment mechanisms.

SUMMARY OF THE INVENTION

The present invention utilizes an electrical test probing apparatus for the temporary monitoring of the signals on the pins of high density finely leaded surface mounted LSI circuit packages. The in-circuit test probing apparatus is a means of temporarily contacting attaching test instruments to the leads of leaded surface mounted packages with lead spacing in the order of 0.020 inches. The test probing fixture can easily be moved from one package to another and will easily accommodate the selection of individual pins on a given package. The probing fixture will allow probing of finely leaded devices in the same fashion as the prior art test clips that are commonly used to temporarily attach an oscilloscope probe or other test device to dual-in-line packaged ICs when they are mounted on a printed circuit board.

It is one object of the present invention, therefore, to provide an improved in-circuit test apparatus for leaded packages.

It is another object of the invention to provide an improved in-circuit test apparatus which permits signal monitoring on the pins of high lead density surface mounted circuit packages.

It is still another object of the invention to provide an improved in-circuit test apparatus which is easily movable from one circuit package to another on a PC board and from one PC board to another.

It is yet another object of the invention to provide an improved in-circuit test apparatus wherein the probing mechanism within the test probe apparatus is easily moved to different pins on a given circuit package.

It is still another object of the invention to provide an improved in-circuit test apparatus wherein the test probe apparatus will allow multiple pins to be observed at a given time.

It is an even further object of the invention to provide an improved in-circuit test apparatus wherein recessed magnets are utilized to attach the test probe apparatus to the circuit package.

It is yet a further object of the invention to provide an improved in-circuit test apparatus wherein a silicon rubber hold fixture is utilized to hold the test probes and to allow their easy insertion and removal.

These and other advantages, objects and features of the invention will become more apparent after considering the following description taken in conjunction with the illustrative embodiment in the accompanying drawings.

DESCRIPTION OF THE PREFERRED EMBODIMENT

Figure 1:
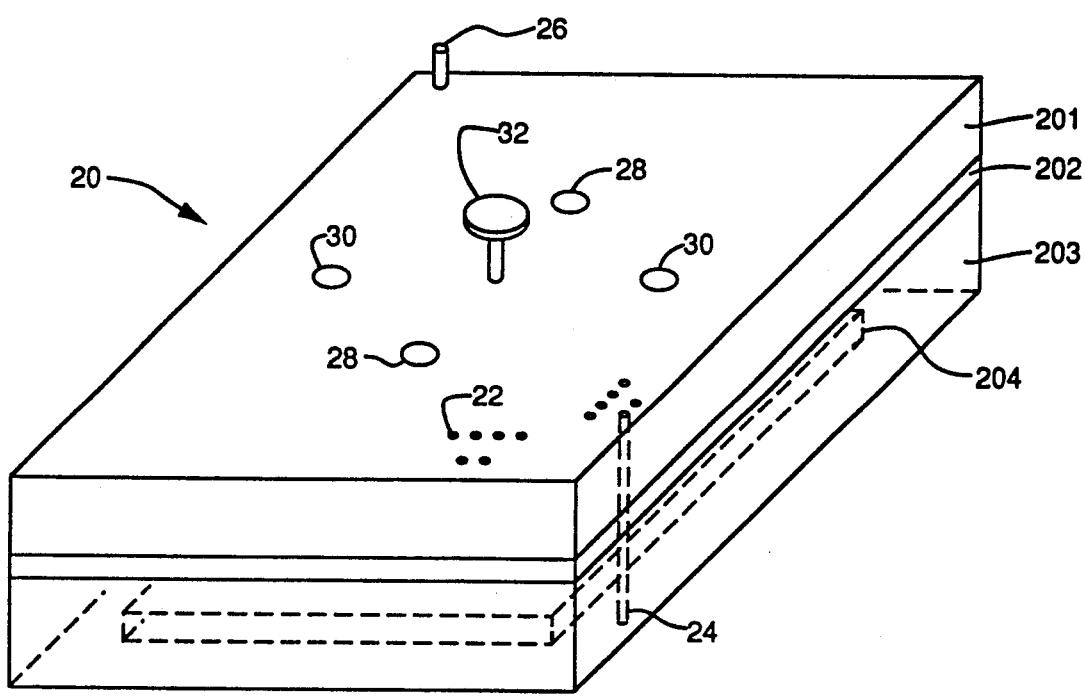
FIG. 1 is an isometric view of the in-circuit test probe apparatus according to the present invention.

Referring now to FIG. 1, there is shown an isometric view of the in-circuit self-aligning/fastening test probe apparatus 20. The in-circuit test probe apparatus 20 comprises a rough (or coarse) probe location unit 201, a probe holding unit 202 and a fine probe location unit 203. The fine probe location unit 203 includes a fine location unit cavity 204. The rough probe location unit 201 and the fine probe location unit 203 may be constructed of a fiber glass epoxy material such as printed circuit board material or any other suitable commercially available hard plastic material.

The fine location unit cavity 204, for the present example, may be dimensionally scaled to locate therein a finely leaded surface mounted LSI circuit package. The fine location unit cavity 204 utilizes the sides of its cavity to align the fine probe location unit 203 to the edges of the finely leaded circuit package which is under test. The depth of the cavity in the fine location unit cavity 204 is dimensioned to limit and prevent the edges of the fine probe location unit 203 from damaging the fine leads of the circuit package under test.

There is shown, respectively, in the rough probe location unit 201 and the fine probe location unit 203, probe barrel guides 22 and probe alignment holes 24. The rough probe location unit 201 is utilized to locate the barrel of probe unit 26 and thus to assist in aligning the probe tip to the fine probe location unit 203. The probe alignment holes 24 have a smaller probe guiding diameter than the diameter of the probe barrel guides 22. In addition, the fine probe location unit 203 prevents precisely locates the probe tips to allow accurate location to the device leads. The fine probe location unit 203 prevents the operator from applying too much force to the lead by limiting the probe movement (i.e., only the tips of the spring probes are allowed to touch the leads, thus preventing the probe from bottoming against the leads).

The rough probe location unit 201 is used to locate the barrel of the probe unit 26 to assist in aligning the probe tip to the fine probe location unit 203. Furthermore, the rough probe alignment unit 201 and the fine probe alignment unit 203 combine to provide force and alignment of the probe holding unit. It is assumed that the rough probe alignment unit 201, probe holding unit 202 and fine probe alignment unit 203 will be used as a single fixture and will only be separated to repair the fixture. The probe holding unit 202 comprises a layer of silicon rubber with a thickness in the order of 10 to 30 mils (one mil is 0.001 inches) which has been cut at each point 25 that a probe is to be inserted. The cut should be in two directions with a gap of approximately 5 mils between the rubber edges. The probe units 26 may be spring loaded probes similar to the miniature tungsten wire probe, type 880 which are commercially-available from Feinmetall GmbH, Herrenberg, West Germany.

The in-circuit self-aligning/fastening test probe apparatus includes a pair of fastening unit-28 which comprise 4-40 screws. The fastening units pass through the rough probe location unit 201, the probe holding unit 202 and into the fine probe location unit 203 to form a rigid structure. Locating dowels 30 which are attached to the fine probe locating unit 203 are utilized to properly align the rough probe location unit 201, the probe holding unit 202 and the fine probe location unit 203. Four magnets which are located in recessed areas in the fine probe location unit 203 above the fine location unit cavity 204, will be shown and discussed in FIGS. 2a and 2b.

A test fixture removal unit 32 is shown at the center of the probe apparatus 20. The test fixture removal unit 32 is comprised of a non-abrasive screw or knob that may be made of non-conductive material such as plastic, which when turned, is lowered to a package being examined and provides force to break the magnetic hold of the fastening unit. The removal of the unit will only be made when the probes are extracted. The probing unit does not have to uniformly remove itself from all parts of the package; however, the removal unit should be located in the package center for ease of use.

Figure 2A:
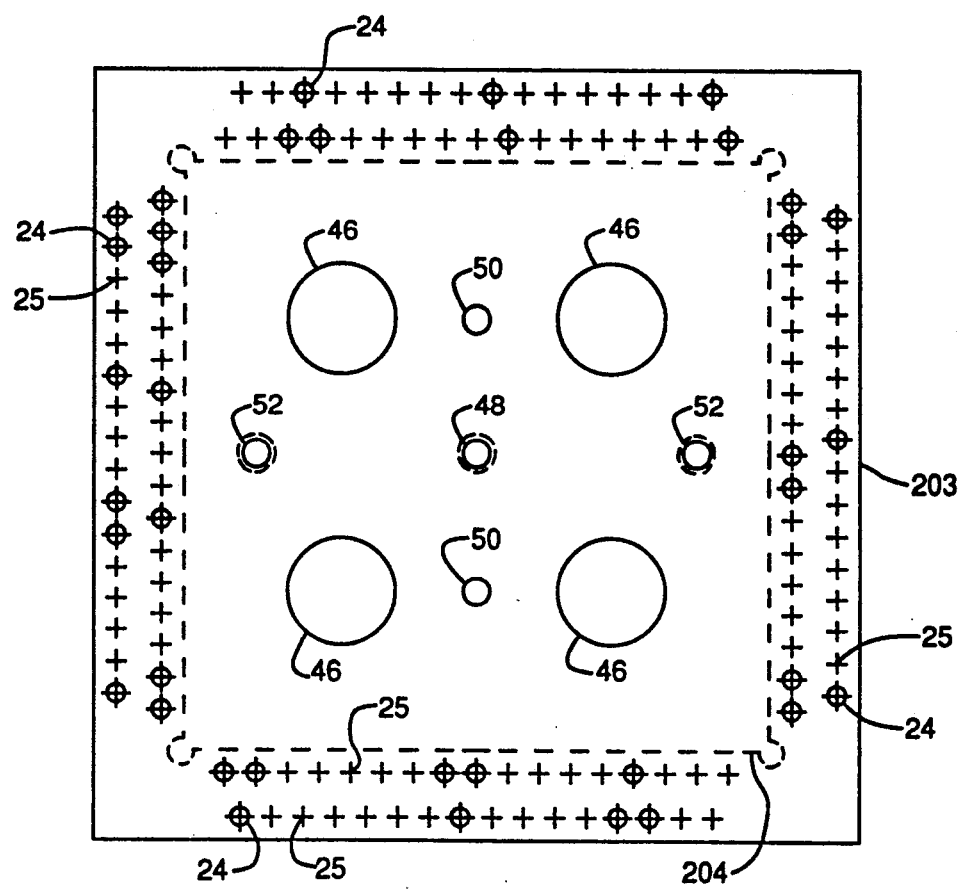
FIG. 2a is a partial top plan view of the fine probe location unit.

Turning now to FIG. 2a, there is shown a top view of the fine probe location unit 203 providing in greater detail the features of the unit. The fine location unit probe alignment holes 24 illustrates two rows of probe alignment holes with the spacing and pattern relationships thereof. This pattern and spacing of the fine location unit probe alignment holes 24 is repeated for all four sides of the fine probe location unit 203. At this point, it should be noted that this spacing and pattern is also utilized on the rough probe location unit 201 of FIG. 1 and that the holes in both the rough and the fine location units are precisely aligned to provide access to an in-circuit packaged leads. However, the probe barrel guides 22 in the rough probe location unit 201 have a larger diameter diameter than the probe alignment holes 24 in the fine probe location unit 203. The fine location unit cavity 204 is shown with rounded corners to accommodate the corners of the surface-mounted circuit package that is under test. The spacing of the first probe hole at each end of the side probe hole pattern with respect to circuit package corner, is dependent upon the circuit package spacing of the first lead with respect to its corner. For this example, the spacing to the first hole would be 0.055 inch.

The attachment unit for the test probe apparatus is comprised of four magnets 46 which are inserted into recesses in the fine probe location unit 203 and are positioned above the fine location unit cavity 204. These magnets will be slightly recessed into the fine location unit to prevent the magnets from scarring the device being examined. The magnets will serve to hold the fixture in place on the package of interest. A number of package lids were surveyed and all were made of a magnetic material. A removal unit access hole 48 which is shown approximately in the center of the fine location unit cavity 204, provides access for the removal unit to the top of the circuit package under test to facilitate removal and disengagement of the test probe apparatus therefrom. The alignment dowel hole 50 accommodates an alignment dowel by which means the test probe apparatus is properly aligned as previously discussed. In addition, there is shown a pair of threaded holes 52 which accept fastening screws to maintain the test probe apparatus as a rigid structure as previously discussed.

Figure 2B:
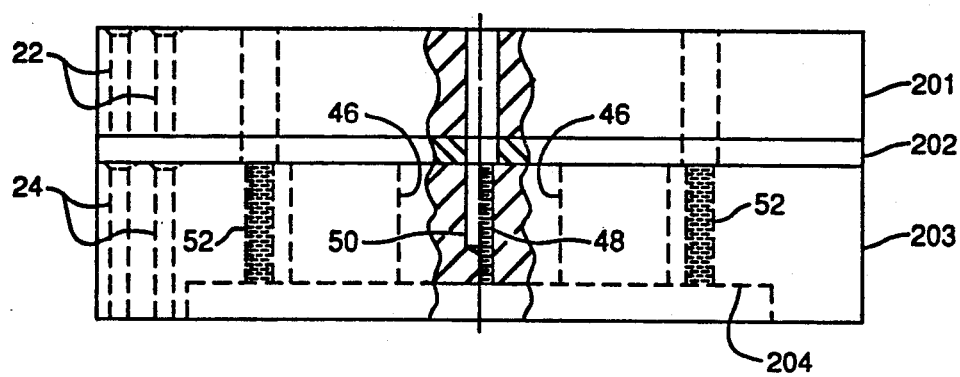
FIG. 2b is a side view of the in-circuit test probe apparatus.

In FIG. 2b, there is shown a side view of the in-circuit test probe apparatus comprising the rough probe location unit 201, a probe holding unit 202 and a fine location unit 203. In this view, the alignment of the probe barrel guides 22 of the rough probe location unit 201 with the fine location unit probe alignment holes 24 may be clearly seen. The diameter of the probe barrel guides 22 is larger than the diameter of the probe alignment holes 24. The other features and elements which are shown in FIG. 2a, have been identified in FIG. 2b also. The in-circuit test probe apparatus is a unique test fixture for the purpose of test probing very finely leaded surface mounted IC packages. It provides the first practical means for observing the signals on the pins of packages with lead spacing in the order of 0.020 inches. However, the present test probe apparatus is not limited to use on packages with lead spacing in the order of 0.020 inches, it can serve equally well for packages with 0.050 inch or greater spacing and likewise for packages with 0.020 inch or less spacing.

Although the invention has been described with reference to a particular embodiment, it will be understood to those skilled in the art that the invention is capable of a variety of alternative embodiments within the spirit and scope of the appended claims.

What is claimed is:

1. An in-circuit test probe apparatus for temporarily monitoring signals on the pins of high density finely leaded surface-mounted LSI circuit package comprising in combination:

a rough probe location member for roughly aligning a plurality of probes, said rough probe location member having shape and which includes means for probe guiding, said probe guiding means being arranged along the outer edge of said rough probe location member, probe holding means for holding said probes, said probe holding means having a predetermined thickness, said probe holding means corresponding to the shape of said rough probe location member, said probe holding means including a plurality of cross-cuts therein which are, respectively, aligned with said probe guiding means, said rough probe location member positioned atop said probe holding means, a fine probe location member for finely aligning said probes, said fine probe location member having a shape corresponding to the shape of said rough probe location member, said fine probe location member including means for probe guiding means, said fine probe location member having a cavity in its lower surface which is equi-disposed about the center of said fine probe location member, said probe holding means positioned atop said fine probe location member, means for fastening, said fastening operatively connected between said rough location member and said fine probe location member to form a rigid body, and whereby said probes removably and selectively inserted into said probe guiding means, through said cross-cuts and through said probe alignment means to extend into said cavity to directly contact a selected pin on said circuit package thereby monitoring the signals thereon, said probe alignment means having a smaller probe diameter than the diameter of said probe guiding means, said cavity of said fine probe location member operatively positioned on a surface-mounted LSI circuit package.

2. A test probe apparatus as defined in claim 1 further including means for attaching, said attaching means being operatively disposed in said fine probe location member substantially in the region of said cavity, said attaching means operatively connecting said test probe apparatus to said circuit package, and means for removal, said removal means operatively connected to said test probe apparatus to engage said circuit package to affect the separation of said test probe apparatus therefrom.

3. A test probe apparatus as defined in claim 2 wherein said probe holding means comprises a layer of silicon rubber with a predetermined thickness.

4. A test probe apparatus as defined in claim 3 wherein said predetermined thickness in the order of 10 to 30 mils.

5. A test probe apparatus as defined in claim 3 wherein said cross-cuts provide a gap between the rubber edges of approximately 5 mils.

6. A test probe apparatus as defined in claim 3 wherein said rough probe location member and said fine probe location member both comprise a substantially hard plastic material.

7. A test probe apparatus as defined in claim 3 wherein said rough probe location member and said fine probe location member both comprise fiberglass epoxy.

8. A test probe apparatus as defined in claim 3 wherein said probing means comprise probes with spring-loaded probes.

9. A test probe apparatus as defined in claim 2 wherein said probe guiding means comprises at least two symmetrically staggered rows of guide holes.

10. A test probe apparatus as defined in claim 2 wherein said probe aligning means comprises at least two symmetrically staggered rows of guide holes.

11. A test probe apparatus as defined in claim 2 wherein said probe guiding mean and said probe aligning means are, respectively, aligned and centered over said pins of said circuit package.

12. A test probe apparatus as defined in claim 2 wherein said attaching means comprise a plurality of magnets.

13. A test probe apparatus as defined in claim 2 wherein said pins have a lead spacing in the order of 0.020 inches or less.

* * * * *